(12) United States Patent
Lemkin et al.

(10) Patent No.: US 9,595,991 B2
(45) Date of Patent: Mar. 14, 2017

(54) LOW POWER RADIO RECEIVER

(71) Applicant: LINEAR TECHNOLOGY CORPORATION, Milpitas, CA (US)

(72) Inventors: Mark Alan Lemkin, Berkeley, CA (US); Thor Nelson Juneau, Menlo Park, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/981,755

(22) Filed: Dec. 28, 2015

(65) Prior Publication Data

US 2016/0112082 A1  Apr. 21, 2016

Related U.S. Application Data

(63) Continuation of application No. 13/550,033, filed on Jul. 16, 2012, now Pat. No. 9,246,436.

(51) Int. Cl.
| | | |
|---|---|---|
| *H04B 1/10* | (2006.01) | |
| *H04B 1/18* | (2006.01) | |
| *H03D 7/14* | (2006.01) | |
| *H04B 1/30* | (2006.01) | |

(52) U.S. Cl.
CPC ............ *H04B 1/18* (2013.01); *H03D 7/1441* (2013.01); *H03D 7/1466* (2013.01); *H04B 1/10* (2013.01); *H04B 1/30* (2013.01)

(58) Field of Classification Search
CPC ... H04B 1/16; H04B 1/18; H04B 1/30; H04B 1/10; H03G 3/20; H03F 1/301; H03F 1/0272; H03L 7/08; H03L 7/087; H03D 7/1441; H03D 7/1466
See application file for complete search history.

(56) References Cited

U.S. PATENT DOCUMENTS

| | | |
|---|---|---|
| 5,594,939 A | 1/1997 | Curello et al. |
| 6,292,474 B1 | 9/2001 | Ali et al. |
| 6,526,262 B1 | 2/2003 | Kurlovich |
| 7,418,250 B2 | 8/2008 | Igarashi et al. |
| 7,512,083 B2 | 3/2009 | Li |
| 7,881,679 B1 | 2/2011 | Faravash et al. |
| 8,086,208 B2 | 12/2011 | Cook et al. |

(Continued)

FOREIGN PATENT DOCUMENTS

| | | |
|---|---|---|
| CN | 101183878 A | 5/2008 |
| EP | 2 688 215 A1 | 1/2014 |

(Continued)

OTHER PUBLICATIONS

U.S. Office Action issued in related U.S. Appl. No. 13/550,033, mailed on Aug. 5, 2013; 7 pages.

(Continued)

*Primary Examiner* — Thanh Le
(74) *Attorney, Agent, or Firm* — McDermott Will & Emery LLP

(57) ABSTRACT

A frequency converting element includes a mixer and a charge pump. The mixer has first and second input nodes and an output node, and an input code of the charge pump is coupled to the output node of the mixer. The charge pump receives a mixer output signal at the input node of the charge pump, and outputs an amplified version of the mixer output signal.

15 Claims, 11 Drawing Sheets

(56) References Cited

U.S. PATENT DOCUMENTS

| | | | |
|---|---|---|---|
| 2003/0011861 A1 | 1/2003 | Casagrande | |
| 2006/0035611 A1 | 2/2006 | Connell et al. | |
| 2010/0285769 A1 | 11/2010 | Conroy et al. | |
| 2011/0026507 A1 | 2/2011 | Katsube et al. | |
| 2011/0092180 A1 | 4/2011 | Chen et al. | |
| 2011/0124307 A1 | 5/2011 | Balankutty et al. | |
| 2012/0133800 A1 | 5/2012 | Jung et al. | |
| 2012/0139591 A1* | 6/2012 | Ozeki | H03L 7/087 327/148 |
| 2013/0015831 A1 | 1/2013 | Wong et al. | |
| 2014/0018028 A1 | 1/2014 | Lemkin et al. | |
| 2015/0333718 A1* | 11/2015 | Lemkin | H03G 3/20 455/234.1 |

FOREIGN PATENT DOCUMENTS

| | | |
|---|---|---|
| TW | 200616360 | 5/2006 |
| TW | I279111 B | 4/2007 |
| TW | 201223138 A | 6/2012 |

OTHER PUBLICATIONS

U.S. Office Action issued in related U.S. Appl. No. 13/550,033, mailed on Feb. 14, 2014; 7 pages.

U.S. Office Action issued in related U.S. Appl. No. 13/550,033, mailed on Aug. 29, 2014; 10 pages.

U.S. Notice of Allowance issued in related U.S. Appl. No. 13/550,033, mailed on Sep. 14, 2015.

Extended European Search Report issued in European Patent Application No. EP 13003571.0 dated Nov. 19, 2013.

Extended European Search Report issued in European Patent Application No. EP 15001492.6, mailed on Sep. 15, 2015.

K. Wang et al., "A Low-Loss Image-Reject Mixer Using Source Follower Isolation Method for DRM/DAB Tuner Applications," IEEE Transactions on Circuits and Systems II: Express Briefs, vol. 58, No. 11, Nov. 2011.

S. Zhou et al., "A CMOS Passive Mixer With Low Flicker Noise for Low-Power Direct-Conversion Receiver," IEEE Journal of Solid-State Circuits, vol. 40, No. 5, May 2005.

T. Chang et al., "ESD-Protected Wideband CMOS LNAs Using Modified Resistive Feedback Techniques With Chip-on-Board Packaging," IEEE Transactions on Microwave Theory and Techniques, vol. 56, No. 8, Aug. 2008.

M. Vidojkovic et al., "A 1.2V Receiver Front-End for Multi-Standard Wireless Applications in 65 nm CMOS LP," Solid-State Circuits Conference, 2008. ESSCIRC 2008. Sep. 15-19, 2008, pp. 414-417.

D. Im et al., "A CMOS Resistive Feedback Differential Low-Noise Amplifier With Enhanced Loop Gain for Digital TV Tuner Applications," IEEE Transactions on Microwave Theory and Techniques, vol. 57, No. 11, Nov. 2009.

K. Wang et al., "A Low-Loss Image-Reject Mixer Using Source Follower Isolation Method for DRM/DAB Tuner Applications," IEEE Transactions on Circuits and Systems—II: Express Briefs, vol. 58, No. 11, Nov. 2011.

B.W. Cook et al., "SoC Issues for RF Smart Dust," Proceedings of the IEEE, vol. 94, No. 6, Jun. 2006.

B.W. Cook Low Energy RF Transceiver Design, Electrical Engineering and Computer Sciences, University of California at Berkeley, Technical Report No. UCB/EECS-2007-57, May 16, 2007.

C. Andrews et al., "Implications of Passive Mixer Transparency for Impedance Matching and Noise Figure in Passive Mixer-First Receivers," IEEE Transactions on Circuits and Systems—I: Regular Papers, vol. 57, No. 12, Dec. 2010.

D. Im et al., "A Broadband CMOS RF Front-End for Universal Tuners Supporting Multi-Standard Terrestrial and Cable Broadcasts," IEEE Journal of Solid-State Circuits, vol. 47, No. 2, Feb. 2012.

C. Andrews et al., "A Passive Mixer-First Receiver With Digitally Controlled and Widely Tunable RF Interface," IEEE Journal of Solid-State Circuits, vol. 45, No. 12, Dec. 2010.

B.W. Cook et al., "Low-Power 2.4-GHz Transceiver With Passive RX Front-End and 400-mV Supply," IEEE Journal of Solid-State Circuits, vol. 41, No. 12, Dec. 2006.

Taiwanese Office Action issued in Taiwanese Patent Application No. 102125414, mailed on Dec. 24, 2014; 14 pages with English translation.

J. Kim, et al. "Low-Power, Low-Cost CMOS Direct-Conversion Receiver Front-End for Multistandard Applications," IEEE Journal of Solid-State Circuits, vol. 48. No. 9; Sep. 2013.

Taiwanese Office Action dated Jan. 13, 2016, issued in related Taiwanese Application No. 102125414. (w/ English translation).

Non-Final Office Action dated Apr. 15, 2016, issued in U.S. Appl. No. 14/714,155.

Chinese Office Action dated Jul. 4, 2016, issued in Chinese Application No. 201310298631.1. (w/ English translation).

Taiwanese Office Action dated Oct. 26, 2016, issued in Taiwanese Application No. 105127530.

* cited by examiner

LOW POWER RADIO RECEIVER

RELATED APPLICATIONS

This application is a Continuation of U.S. patent application Ser. No. 13/550,033, filed on Jul. 16, 2012, the disclosure of which application is incorporated by reference herein.

TECHNICAL FIELD

This disclosure generally relates to the electrical arts, and more particularly to radio receivers.

DESCRIPTION OF RELATED ART

In recent years there has been an effort to reduce power in integrated radio receivers while maintaining performance specifications. A radio receiver typically includes a mixer, which is a nonlinear electrical circuit that creates new frequencies from two signals applied to it, namely an input signal and a local oscillator (LO) signal. Mixers may be active (e.g., include power gain) or passive (e.g., output power is less than or equal to the input). An active mixer improves isolation between the ports, but may have higher noise and consume more power. On the other hand, a passive mixer provides frequency translation of a Radio Frequency (RF) signal down to an intermediate frequency (IF) or baseband frequency with a minimal amount of power consumption. Further, passive mixers have no flicker noise, draw zero current (except the current for driving mixer switches), and have excellent linearity. However, passive mixers generally provide low (i.e., less than unity) gain and suffer from a high noise figure (NF). NF is a measure of degradation of the signal-to-noise ratio (SNR), caused by components in an RF signal chain. Thus, the NF is the ratio of actual output noise to that which would remain if the receiver itself did not introduce noise, expressed in dB.

Conventionally, receivers include a low-noise amplifier (LNA) between an antenna and a passive mixer to provide voltage gain (e.g. amplification of the signal provided by the antenna). In another approach, a mixer input is connected directly to the output of the antenna, thereby further reducing power consumption and improving linearity (e.g., over a system that includes an LNA between an antenna and a passive mixer). However, connecting an antenna directly to a mixer may result in re-radiation, where a portion of the down-converted RF signal generated by the mixer flows back to the antenna. Such lossy phenomenon contributes substantially towards a poor NF. Although there are known methods to improve the NF (e.g., an 8-phase mixer, many mixer switches and controls, etc.), they impose a substantial power penalty. Accordingly, it would be desirable to have a radio receiver that consumes low power and has a low NF. It would be further desirable to have gain in a front-end path of the radio receiver (i.e., front-end path being from the antenna port to the baseband or IF output port), such that an equivalent noise resistance at the output of the front-end is high enough to allow low-power blocks to follow the front-end. It would be further desirable to provide for a wide enough bandwidth for various wireless communication standards, including narrow-bandwidth signals (802.15.4, Bluetooth, etc.) as well as wide-band signals WiFi (e.g., 802.11.ac).

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The various examples discussed below provide for radio receivers that consume low power and have a low noise figure (NF). In one aspect, the concepts embodied herein provide for a wide enough bandwidth for various wireless communication standards, including WiFi (e.g., 802.11.ac). The benefits are achieved in part by providing an antenna (and/or an optional matching circuit) isolation from one or more mixer inputs of a radio receiver. Reference now is made in detail to the examples illustrated in the accompanying drawings and discussed below.

Figure 1:
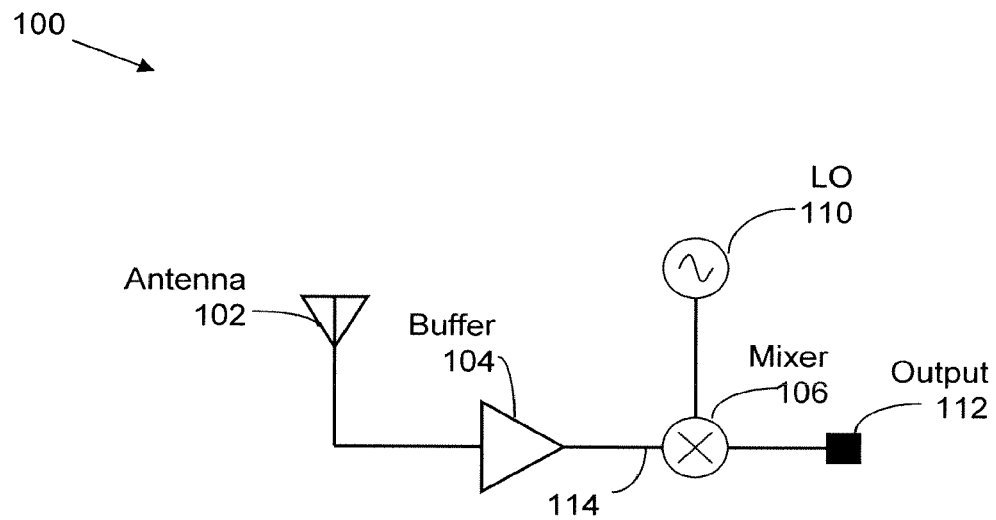
FIG. 1 illustrates a passive low power radio receiver consistent with an embodiment of the present invention.

FIG. 1 illustrates a passive low power radio receiver 100 consistent with an embodiment of the present invention. Receiver 100 includes an antenna 102, a buffer 104 coupled to the antenna 102, a passive mixer 106 coupled to the output of the buffer, a local oscillator (LO) 110 coupled to the mixer 106, and an output 112. In some embodiments digital logic or other circuit (e.g., a NAND gate, a NOR gate, an XOR gate, a buffer, an inverter, etc.) is inserted between the LO output(s) and the mixer LO input(s) to isolate the LO 110 from the mixer 106; or to change an aspect of the LO waveform (e.g., DC bias level, duty cycle, amplitude, or slew rate).

Antenna 102 is a passive component that receives ambient electromagnetic signals (e.g., signal of interest, background noise, and other signals). Antenna 102 may be wide or narrow band and may be configured to have any impedance value (e.g., 50Ω).

Mixer 106 is a non-linear electrical circuit that creates a new frequency at the output node 112 based on the signal from the antenna 102 and the frequency from the LO 110. For example, mixer 106 is passive, where the signal at the output 112 has a power equal or lower than the signal from the output of buffer 104. It should be noted that the buffer 104 adds power to the radio receiver 100. Thus, the power at the mixer 106 output 112 may be higher than the power at the antenna 102 output. When the output 112 includes a capacitive load (discussed in more detail later), the input impedance (at node 114) of such a capacitively-loaded passive mixer 106 appears almost as an open for frequencies equal to or near the LO 110 frequency. However, the input impedance of the mixer 106 at node 114 drops as the input frequency to node 114 moves away from the LO 110 frequency. For a constant frequency offset the input impedance at node 114 of the mixer 106 also drops as the mixer capacitance at output 112 increases.

In one embodiment, to provide a wide enough input bandwidth to the mixer 106 such that it can translate the signal from the antenna 102 to a lower frequency, the mixer input at node 114 is driven with a sufficiently-low impedance. In this regard, for a fixed LO offset frequency and fixed load capacitance at node 112, there is an inverse relationship between mixer bandwidth and the impedance of its driver. For example, when a novel switch-capacitor voltage booster (discussed later) is used, the capacitance of such booster presents a substantial capacitive load to the mixer output node 112.

Buffer 104 is a low-noise buffer that is configured to provide load isolation from the mixer 106. For example, buffer 104 provides impedance isolation between the antenna 102 and the mixer 106. The input impedance of the buffer 104 is higher than an output impedance of the buffer 104. Buffer 104 may be an active device but has a voltage gain of one or less. By nature of the impedance transformation, the buffer 104 provides power to the radio receiver 100. Further, including a buffer 104 between the antenna 102 and mixer 106 provides for wide(r)-band applications such as WiFi, since the impedance of the antenna 102 (and match circuit between 102 and 104, when present—which is discussed later) and the impedance of the mixer input 114 may be adjusted independently. Thus, the source impedance of the receiver (i.e., antenna 102) is not required to drive the input impedance of the mixer directly.

Figure 2A:
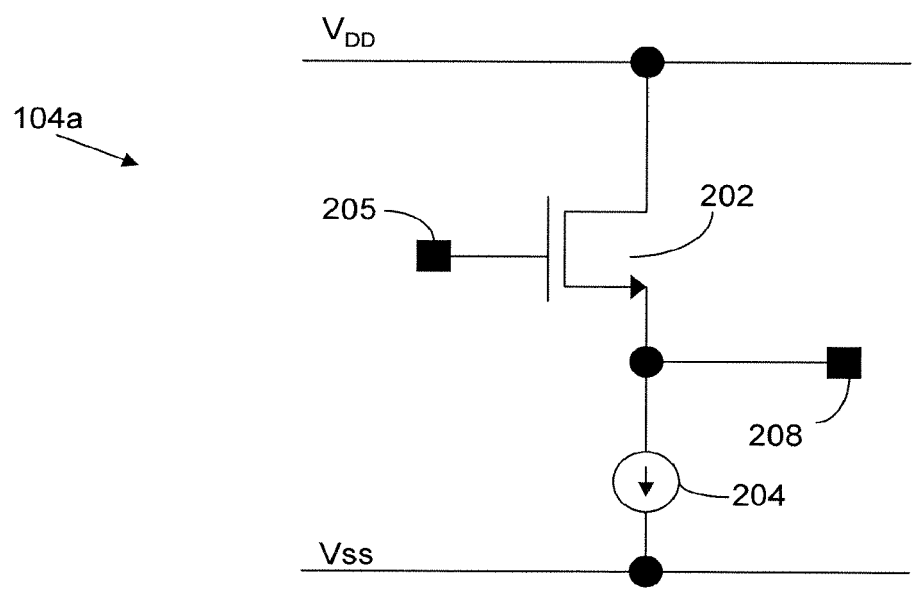
FIG. 2a illustrates an exemplary low noise buffer consistent with an embodiment of the present invention.

FIG. 2a illustrates an exemplary low-noise buffer consistent with an embodiment of the present invention. Buffer 104a of FIG. 2a includes a Metal Oxide Semiconductor (MOS) transistor 202 configured as a source follower having the drain coupled to a voltage source (e.g., VDD) and its source coupled to a current source 204. In various embodiments current source 204 may be a polysilicon resistor, a thin-film resistor, a diffusion resistor, a transistor current source, or any other appropriate current source. The input 205 is at the gate and the output 208 is at the source of the transistor 202. In one example, the output 208 of the buffer 104a is capacitively coupled to a mixer similar to mixer 106 by including a capacitor (not shown in FIG. 2a) in series with output 208. When configured as a source follower, transistor 202 has reduced Miller capacitance compared to conventional devices using an LNA. While an NFET 202 is used for exemplary purposes in FIG. 2a (and in subsequent figures), it will be understood, that a PFET or various other types of active devices may be used for the buffer, including without limitation PNP- or NPN-BJT, or compound semiconductors (e.g., GaAs, InP, HEMT, etc.).

Figure 2B:
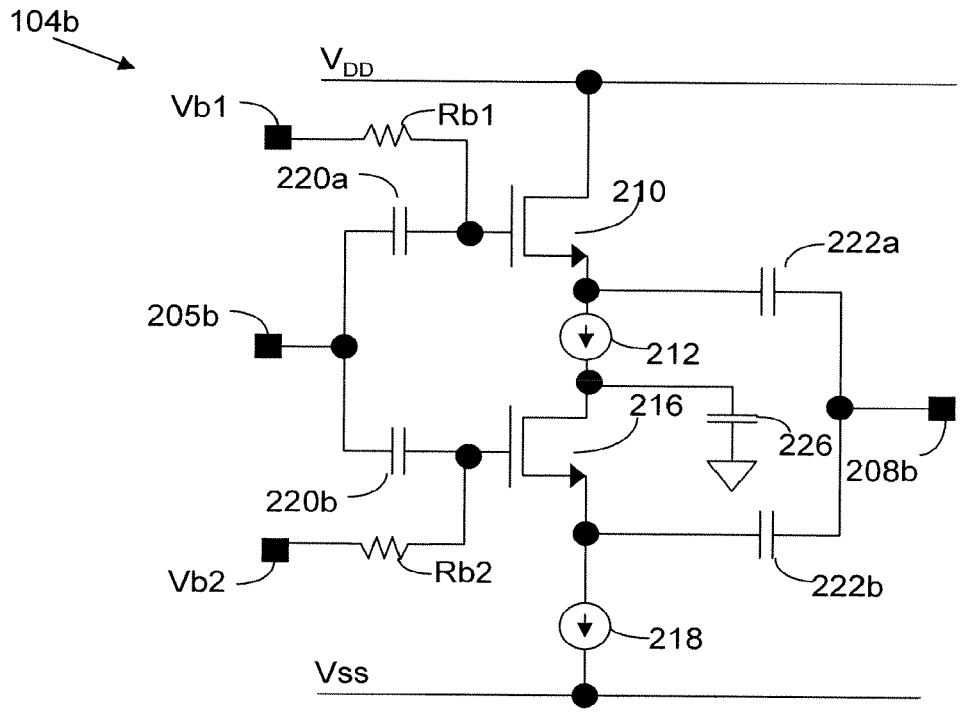
FIG. 2b illustrates an exemplary low noise buffer where two source followers of the same type are stacked on top of one another.

FIG. 2b illustrates another exemplary low-noise buffer 104b consistent with an embodiment of the present invention. Buffer 104b includes two source followers (210 and 216) that are stacked on top of one another. In one embodiment, both transistors 210 and 216 are of the same type (e.g., both NMOS or both PMOS). Stacking of transistors 210 and 216 decreases the impedance presented to the mixer (that is coupled to the output 208b of the buffer) while conserving current. For example, current is conserved (e.g., reused) because the bias current that flows through 210 is reused to bias 216. Buffer 104b includes a first current source 212 coupled between the source of the first transistor 210 and the second transistor 216. A second current source 218 is coupled between the source of the second transistor 216 and Vss. In one embodiment, the input to the buffer 104b is AC coupled to the gates of transistors (e.g., source followers) 210 and 216 through capacitors 220a and 220b. Similarly, the output 208b may be AC coupled to the sources of transistors 210 and 216 respectively, through capacitors 222a and 222b. In one embodiment, the gates of transistors 210 and 216 are biased by DC voltage sources Vb1 and Vb2 through resistors Rb1 and Rb2 respectively. For example, the gates of transistors 210 and 216 are biased through Vb1 and Vb2 to accommodate the respective operating threshold voltage of each transistor. Since there is a threshold voltage drop across transistor 210, the bias voltage Vb2 may be different (e.g., less) than Vb1.

In one example, when multiple source followers (e.g., NFET 210 and NFET 216) of the same type are stacked, a current source (e.g., 212 and 218, respectively) is provided for each source follower. The drain of the second source follower 216 is AC grounded through a capacitor (e.g. $C_{vg}$ 226). The source of each transistor 210 and 216 AC-tracks the signal at the input 205b. In the configuration of 104b, there is a tradeoff: half of the output swing is sacrificed for a lower impedance at the output 208b, for the benefit of reusing current.

Even though stacking source followers may reduce the output voltage swing of low noise buffer 104b, the voltage swing at the output 208b is generally small enough that the benefits of stacking the source followers 210 and 216 substantially outweigh reduction in output swing (if any) at the output 208*b*. The voltage swing at output 208*b* is often small because the desired RF signal at the antenna is usually small. However, in some cases, for example when the receiver is located close to an in-band or an out-of band RF source, the output signal at 208*b* will be large enough so that the loss of output swing results in a performance degradation (e.g. reduced IIP3 or 1-dB compression point). Beneficially, stacking the source followers 210 and 216 lowers current consumption for the same performance; or provides a lower NF with increased bandwidth for a constant current. It will be understood, based on the teachings herein, that more than two source followers may be stacked on top of one another.

Figure 2C:
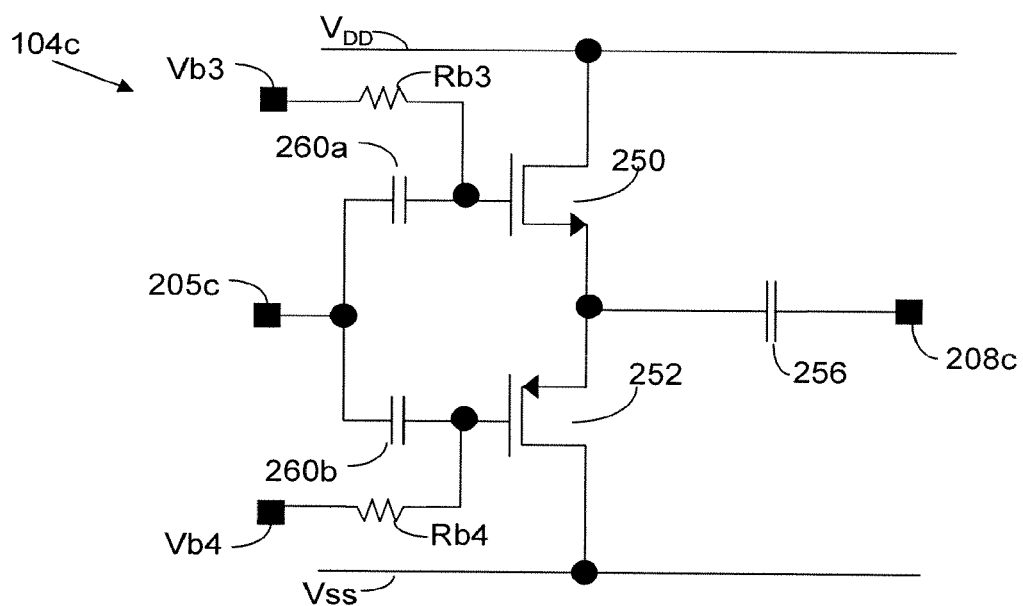
FIG. 2c illustrates an exemplary low noise buffer where two source followers of different type are stacked on top of one another.

FIG. 2*c* illustrates an exemplary low noise buffer 104*c* consistent with an embodiment of the present invention. In buffer 104*c*, NMOS and PMOS source followers (i.e., 250 and 252) are connected in series. The gate of each transistor 250 and 252 is biased by Vb3 through resistor Rb3 and Vb4 through resistor Rb4 respectively based on the particular function of the buffer desired. For example, by configuring the DC voltage sources Vb3 and Vb4 and their respective series resistors Rb3 and Rb4, the source followers (i.e., transistors 250 and 252) are configured to operate as class-A, class-B, or class-AB circuits. The input 205*c* to the buffer 104*c* is AC coupled to the gates of transistors (e.g., source followers) 250 and 252 through capacitors 260*a* and 260*b* respectively. The output 208*c* may be AC coupled to the source of each transistor 250 and 252, through capacitor 256.

Figure 2D:
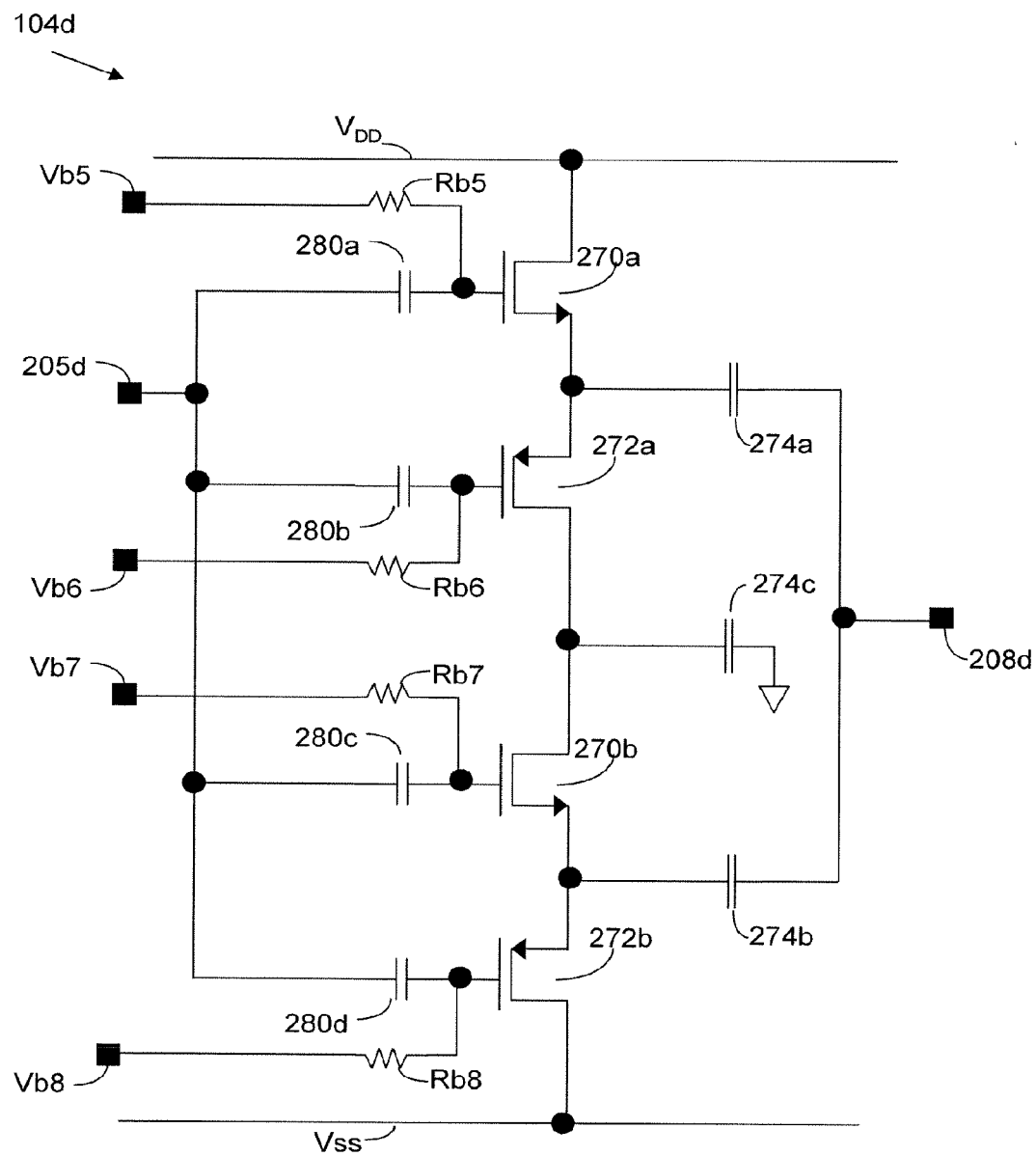
FIG. 2d illustrates a buffer where two pairs of source followers are stacked on one another.

In some embodiments, two or more pairs of NMOS/PMOS source followers are stacked in series on top of one-another. In this regard FIG. 2*d* illustrates a buffer where two pairs of NMOS/PMOS source followers (270*a*, 270*b*, 272*a*, and 272*b* respectively) are stacked on one-another. The concepts embodied in buffer 104*d* are similar to those discussed in the context of 104*c* and 104*b*. Accordingly, each component will not be discussed in detail for brevity.

In one embodiment the bandwidth of the receiver 100 can be adjusted by changing the buffer (e.g., FIGS. 2*a* to 2*d*) bias point; by adding or subtracting capacitance at the mixer 106 output 112, including a voltage-booster (discussed later), or by capacitors within the voltage booster; by adjusting the sample rate of the voltage booster; or by adjusting the mixer switch size, duty cycle, dc bias, and/or drive amplitude. While the buffers 104*a* to 104*d* have been described as single ended, it is understood that the teachings may be applied to differential embodiments as well.

In one embodiment the body (i.e., bulk) of each transistor is connected to a supply rail (e.g., GND for NMOS; VDD for PMOS). In one embodiment, the body is tied to a reference voltage to reduce backgate, or body, effect. The body effect may also be attenuated by tying the body of each transistor to the its source. For NMOS, a deep N-well is used in a p-substrate process to isolate the NMOS from the substrate. A PMOS source follower may be used with the PMOS body (N-Well) tied to the PMOS source in a p-substrate process. A SIMOX- or SOI-process may be used, thereby providing a low parasitic-capacitance-to-substrate path for tying the substrate to the source of a transistor or leaving the body floating or depleted; or any other appropriate buffer is used between the match and mixer.

As provided in the context of the discussion of FIG. 1, buffers 104*a* to 104*d* provide no voltage gain; however, they do provide power gain by virtue of presenting a lower output impedance. Indeed, when considering the body effect of the source followers, a buffer may attenuate the voltage as measured at input 205. In one example, buffers discussed herein contribute a small amount of noise in comparison to the noise of the RF input and provide a higher input impedance than the input impedance of the mixer 106 at a predetermined distance (e.g., 25 MHz) from the local oscillator frequency. Further, a buffer is configured to provide an output impedance that is lower than the impedance provided to the buffer input, where the impedance provided to the buffer input is from the antenna or a match circuit output (discussed later). It will be understood that the output impedance of the buffer can be tailored through bias choice and transistor sizing by conventional methods and therefore is not discussed in detail.

Figure 3A:
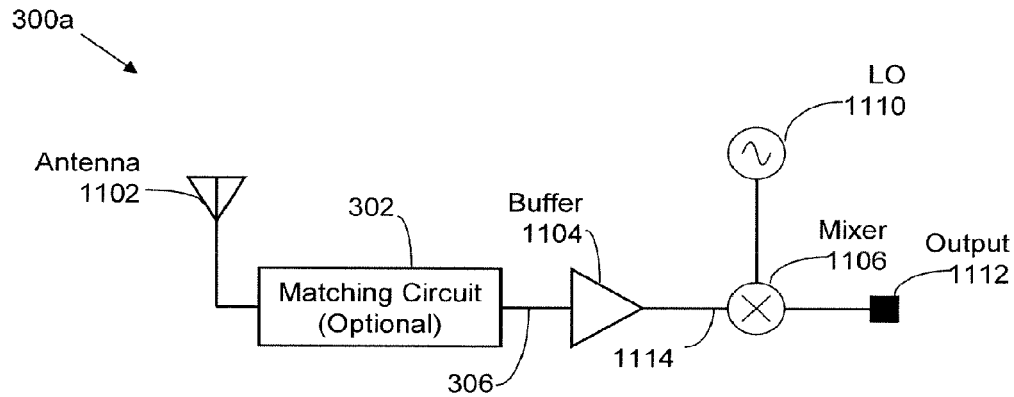
FIG. 3a illustrates a passive low power radio receiver with an optional matching circuit consistent with an embodiment of the present invention.

FIG. 3*a* illustrates a passive low power radio receiver 300*a* with an optional matching circuit 302, consistent with an embodiment of the present invention. The buffer 1104 provides impedance isolation, thereby buffering the match circuit 302 such that the match is not directly loaded by the mixer 1106 input 1114. The loaded Q of the input matching circuit 302 may be relatively flat over a signal bandwidth of interest, in which case the bandwidth of the receiver 300*a* may be set by the buffer 1104 and mixer 1106 characteristics. By including a buffer 1104 between the matching circuit and the mixer, the match is buffered from the input impedance of mixer 1106, thereby providing a wider bandwidth for the receiver 300*a*. Further, including a buffer 1104 allows the mixer 1106 to drive a larger capacitive load at output 1112 for the same bandwidth. Thus, the impedance looking into the buffer 1104 at node 306 is high while the impedance looking into the buffer 1104 at node 1114 is low. Put differently, the input impedance of the buffer 1104 is higher than its output impedance. Further, the input impedance of the input node 306 of the buffer 1104 is higher than the impedance at the second input node 1114 of the mixer 1106 for at least a portion of the selected channel bandwidth. These concepts are described later in more detail.

Figure 3B:
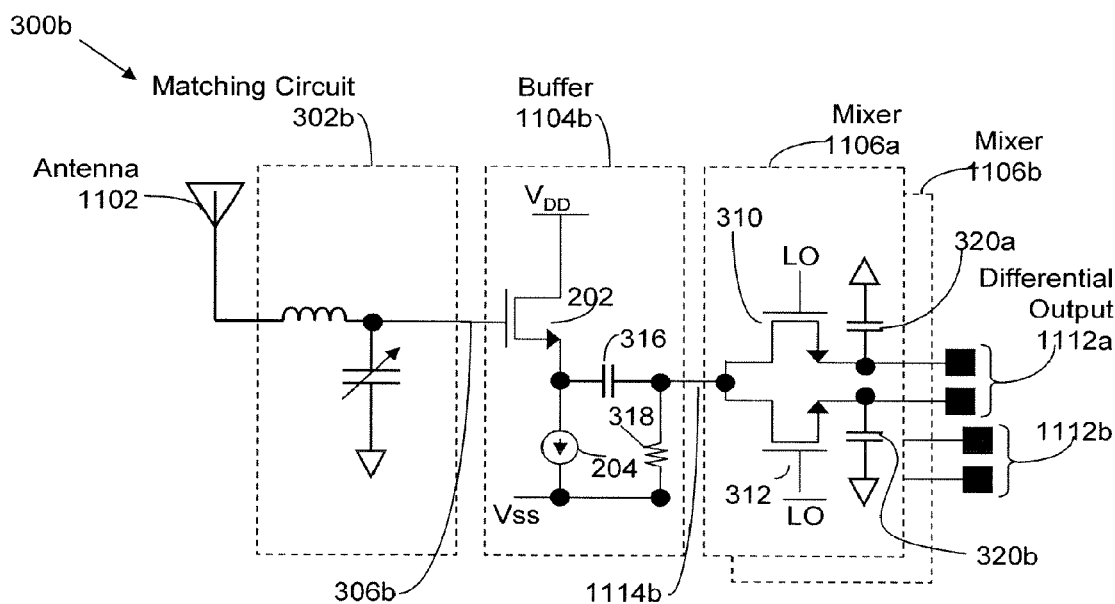
FIG. 3b illustrates a more detailed view of a passive low power radio receiver with a matching circuit, consistent with an embodiment of the present invention.

FIG. 3*b* illustrates a more detailed view of a low power radio receiver 300*b* with a matching circuit 302*b*, consistent with an embodiment of the present invention. In this example matching circuit 302*b* is placed between the antenna 1102 and the buffer 1104*b*. In some embodiments, passive signal conditioning (e.g. a Surface Acoustic Wave (SAW) filter, a Bulk Acoustic Wave (BAW) filter, a passive filter, or an additional matching network comprising passive elements such as capacitors, inductors, and resistors) can be used to filter out-of-band interferers either before or after the matching network. In the example of 302*b*, the matching circuit 302*b* comprises passive components (e.g., inductor, capacitor, etc.) In one embodiment, the matching circuit 302*b* converts the antenna impedance (e.g. 50 ohms) to higher impedance, which is provided to the buffer input. Accordingly, the voltage signal from the antenna 1102 is increased at the output 306*b* of the matching circuit 302*b*, thereby providing voltage gain, which reduces the effect of noise sources in the front-end circuits (including the buffer).

The bandwidth of the receiver is determined in part by the impedance presented to the mixer input at node 1114*b*. Thus, the bandwidth may be reduced when directly driven by a matching circuit 302*b* that raises the impedance. As discussed above, the low-noise buffer 1104 provides isolation between the matching circuit 302*b* and the mixer 1106*a* and 1106*b*. At the input of the low-noise buffer (306*b*) the matching circuit 302*b* sees the small capacitive and resistive load of the buffer input (e.g., the gate of the follower in buffer 1104*b*). The combination of the capacitor 316 and resistor 318 provides DC blocking (through capacitor 316) and optional level shifting (through resistor 318) of the signal from the buffer output. In one example, the values for the capacitor 316 and resistor 318 are chosen such that the AC signal received from the output of the source follower 202 is not appreciably attenuated (e.g., less than 1 dB of attenuation). Thus, the capacitor 316 passes the RF signal from the output of source follower 202 and the resistor 318 sets the DC value for the input to the passive mixer 1106a and 1106b.

At the output (e.g., node 1114b) of the buffer 1104b, mixer (e.g., 1106a) sees approximately 1/gm of the source follower (adjusted for the body effect). It will be understood that this resistance value can be configured to 50 ohms or less in deep submicron process (e.g., 65 nm CMOS). Further, the source follower 202 provides reverse isolation. Accordingly, the LO feed-through from the mixer 1106 to the antenna 1102 is reduced. For example, the coupling between the mixer input, where LO feed-through is present and the antenna 1102 is only through the small gate capacitance of the source follower 202 through the matching circuit 302b. It should be noted that LO feed-through may be regulated by governmental bodies. If a receiver emits LO feed-through above a predetermined regulatory threshold, the receiver may be prohibited from operation.

As illustrated in FIG. 3b, the receiver 300b may include one or more mixers (e.g., 1106a and 1106b). Accordingly, a plurality of passive mixers may be coupled to the low-noise buffer 1104b output 1114b. For example, there may be two passive mixers (e.g., driven in quadrature) having differential outputs 1112a and 1112b respectively, to provide quadrature down conversion. Each passive mixer 1106a/b may comprise a single switch and a capacitor; may be single-balanced as shown in FIG. 3B; may be fully-balanced; or may be any other known configuration that performs frequency translation from an input to an output passively. What is shown in circuit 300b is a single-ended input to differential output balanced mixer 1106a, which can be configured to output quadrature signals by including mixer 1106b, which is driven by 90-degree phase shifted LO signals (shifted with respect to LO and LObar). In some embodiments a differential capacitance is provided via two single-ended capacitors 320a and 320b to a ground, such that the common-mode capacitance to ground is above a predetermined threshold. In this regard, the common-mode voltage variation at the output (1112a and/or 1112b) is suppressed.

Figure 4A:
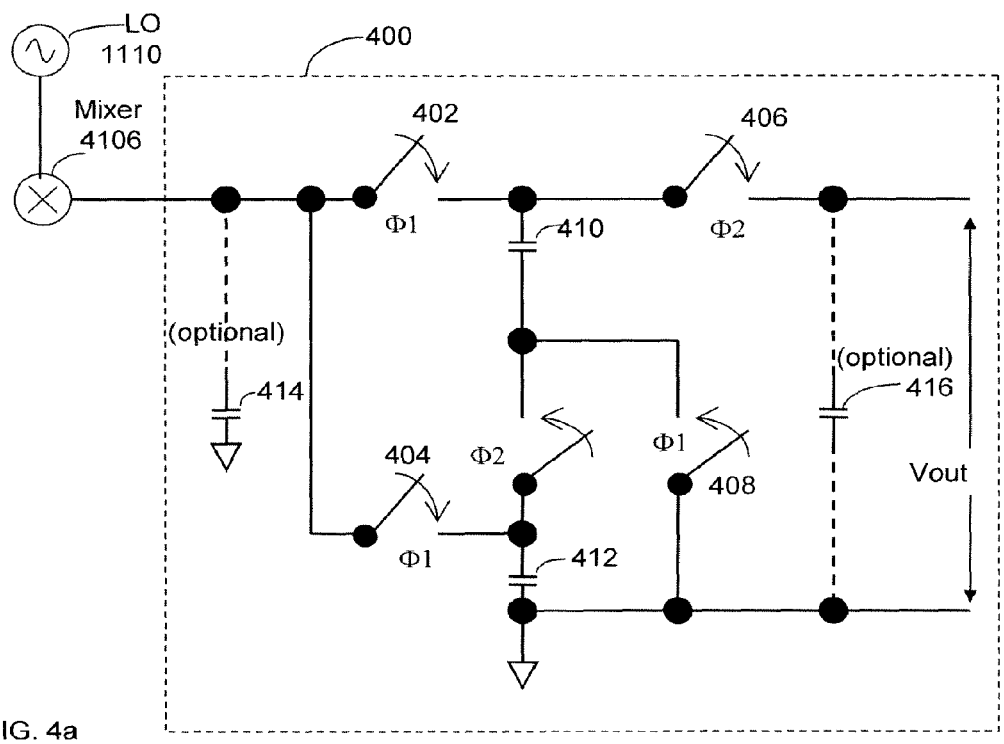
FIG. 4a illustrates a passive voltage booster circuit that is coupled to the output of a mixer, consistent with an embodiment of the present invention.

FIG. 4a illustrates a passive voltage booster circuit 400 that is coupled to a mixer 4106 (e.g., a passive or an active mixer), consistent with an embodiment of the present invention. For example, the voltage booster circuit 400 amplifies the voltage of the signal received from the mixer 4106. In one embodiment the voltage booster 400 uses switch-cap techniques to boost a voltage from its input and provide it at its output (described in more detail below). However, any known passive configuration for transforming impedance may be used including (but not limited to) a Dickson charge pump.

Figure 4B:
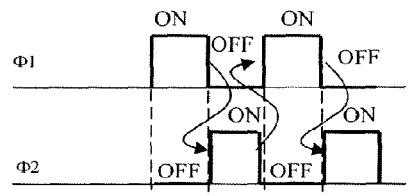
FIG. 4b is a time diagram illustrating the phase relationship between a sampling phase $\phi 1$ and a gain phase $\phi 2$, consistent with an embodiment of the present invention.

In the example of FIG. 4a, during a sampling phase φ1 the voltage booster 400 provides a path from the mixer 4106 to a plurality of sampling capacitors (e.g., 410 and 412) configured in parallel to the baseband output of the mixer. Thus, voltage boost capacitors 410 and 412 are charged to substantially the same voltage as provided by the output of the mixer 4106. During a gain phase φ2 the sampling capacitors 410 and 412 are connected in series, stacking the voltage across capacitor 410 on top of capacitor 412, thereby providing voltage gain (e.g., doubling in this example). By way of example, FIG. 4b illustrates that sampling phase φ1 does not overlap gain phase φ2. In some embodiments the active portion of phi1 and phi2 overlap in time. The duration of "ON" and "OFF" of each phase, in addition to the frequency of these signals, is tailored for each application. In various embodiments the voltage booster may be single ended or differential.

In the example of circuit 400, the voltage gain is approximately double, with a theoretical power consumption of zero (assuming ideal switches and capacitors). While voltage is increased in the voltage booster 400, there is total power loss due to non-ideal characteristics of the components. It will be understood that two, three, four, or any other number of sampling capacitors can be stacked in series during the gain phase φ2 based on the specific design requirements for an application, (e.g., desired gain and bandwidth).

In one embodiment, the series combination of voltage boost capacitors 410 and 412 is coupled in parallel with a capacitor 416 during the gain phase φ2 to provide signal conditioning, (e.g., spur and glitch reduction; filter high frequency energy; etc.). Similarly, in one embodiment the incoming signal from the mixer 4106 can be conditioned through capacitor 414.

Figure 5:
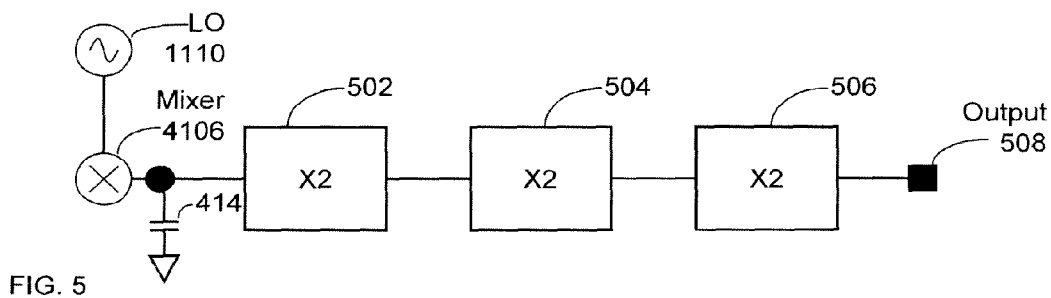
FIG. 5 illustrates a plurality of voltage boosters cascaded one after the other, consistent with an embodiment of the present invention.

FIG. 5 illustrates a plurality of voltage boosters cascaded one after the other to increase the gain of the front-end, consistent with an embodiment of the present invention. For example, by cascading three ×2 voltage boosting circuits 502, 504, and 506, a gain of 8 is realized. By cascading voltage booster stages in series, the switches and capacitors may be optimized by having smaller dimension switches and capacitors farther out in the cascade. For example, there is less susceptibility to noise as the desired signal amplitude is higher. Thus, the size of the switches and capacitors in booster circuit 506 may be smaller than the booster circuit 502. Put differently, the capacitance, switch size, (among other parameters) are adjusted for cascaded gain stages 502, 504, and 506, wherein the stages at the end of the cascade (e.g., 504 and 506 in this example) have smaller switches and capacitors to optimize a performance metric which may include size and or power consumption as well as bandwidth, gain, and/or noise figure.

It should be noted that the capacitance seen by the passive mixer is strongly affected by the capacitive load at the output 508. For example, if there is a 1 pF load at the output 508, it translates to a 64 pF capacitance seen by the mixer 4106. That is because the input capacitance of the voltage booster is a function of the $(\text{gain})^2$. Since we have a total gain of eight in this example (e.g., 2×2×2) due to the three gain stages 502, 504, and 506, we have $8^2 \times 1$ pF=64 pF. The buffer 1104 discussed herein effectively isolates the mixer 4106 (e.g., with its high capacitive load) from the antenna (and matching circuit, if present).

In one embodiment, the voltage booster is clocked at a frequency that is lower than the mixer LO frequency (for example, to save power in clock drivers, or to place zeros at a specific point in the frequency response of the voltage booster), while in another embodiment each voltage booster stage in a cascade of multiple voltage booster stages may be run at a different frequency. Of course, each stage can also be run at the same frequency.

In one embodiment, a gain control function is realized by at least one of the following: (i) adjusting the number of capacitors sampled in parallel and subsequently connected in series; (ii) disabling one or more voltage boosters; (iii) taking the output from a different voltage booster or cascaded voltage boosters; (iv) and operating the voltage booster circuit backwards, such that a desired gain (e.g., ½) is provided.

As to disabling one or more voltage boosters, there may be a mode that bypasses the respective capacitors. In one example, additional switches are added or different logic signals are generated to the existing switches to allow a signal from the Mixer 4106 to pass through without applying voltage gain.

As to operating the voltage booster circuit backwards, in one example, the incoming voltage signal is sampled in series across a plurality of sampling capacitors in a first phase, and providing the voltage at the output in parallel in a second phase. As further regards operating the voltage booster circuit backwards, while the current at the output is increased, the voltage at the output is effectively divided by the number of sampling capacitors connected in parallel during the second phase.

Referring back to FIG. 4*a*, in one embodiment, input impedance of the voltage booster 400 (e.g., as seen by the mixer 4106) is dependent on the output capacitor 416 (if present) as well as the voltage boost capacitors 410 and 412. Because the voltage booster circuit 400 acts similarly to a transformer, the effective capacitance at the output referred to the mixer input is increased by a factor of $N^2$, where N is the voltage gain of the combined voltage booster stages. However, additional input capacitance is seen by the mixer due to the internal capacitance of the voltage booster stage (s) (e.g., stages 502, 504, and 506 of FIG. 5).

Amplifying the signal passively at the mixer 4106 output through one or more stages (e.g., 502 to 506) provides increased linearity as well as reduces the noise requirement on any active circuits that are connected to output 508 (e.g., downstream amplifiers, filters, and ADC's). In this regard, the power consumption of the overall receiver system is lowered.

In one embodiment the output noise at an output of a receiver that includes at least one boosting circuit is similar to the noise of a 32k resistor (e.g., as opposed to a 50 Ohm resistor at the front end). Because the equivalent output noise resistance has been increased via the voltage boosters (which increases the desired signal as well as the noise), a smaller amount of current is required for biasing subsequent signal processing blocks. Further, improved linearity (e.g., as compared to common-source amplifiers or common-gate amplifiers) may be provided by not amplifying the signal before down conversion (e.g., converting from RF to baseband, which may be before the mixer input).

Referring back to FIG. 4*a*, at the output of the mixer (e.g., at the voltage booster circuit 400) signal processing may be performed by switches (e.g., 402, 404, 406, and 408) and voltage boost capacitors (e.g., 410 and 412), while additional signal conditioning may be performed by optional capacitors at the input and output of the voltage booster circuit 400 respectively (e.g., 414 and 416). In this regard, assuming the switches of the booster circuit 400 are big enough and driven hard enough to fully switch the signals at large amplitude, the front-end linearity should be very good. In one embodiment, the front end of the receiver includes a voltage controlled oscillator (VCO) and a single matching inductor (not shown). For example a bond-wire or planar inductor may be used. For example, a VCO (e.g., regular or quadrature) may run at the mixer 4106 LO-input frequency. In some embodiments the VCO runs at twice the mixer LO-input frequency; the VCO outputs are divided in half to drive the mixer switches (e.g., 310 and 312 in the example of FIG. 3*b*) enabling two mixers to be driven in quadrature.

In one embodiment a LO-buffer (e.g. an inverter, an amplifier, or cascade of inverters or amplifiers) is used to isolate the mixer switches (e.g., 310 and 312) from the VCO, thereby helping preventing LO pulling in response to large input signals. In one embodiment the mixer switches 310 and 312 are coupled to the VCO (which may comprise a tank circuit) such that the mixer switch capacitance (e.g., of 310 and 312) may be resonated out by the VCO inductance, thereby further decreasing power consumption.

In one embodiment a VCO comprises a ring oscillator having an odd number of inverters connected in a loop (e.g., without an inductor). The VCO frequency may be locked to a predetermined reference through a phase-locked loop which may be an integer-N or a fractional-N Phase Locked Loop (PLL). Since there is no inductor, the oscillator in particular (and the receiver in general) may be reduced in size. Further, an inductorless VCO reduces coupling from the oscillator signals into the sensitive RF input to the mixer, thereby lowering LO feed-through and its associated problems, as discussed above. An inductor-less VCO also allows placement of an inductor-based switching DC-DC converter close to the VCO since there is no VCO inductor to be magnetically coupled to the DC-DC converter inductor. Conventional VCO's are extremely sensitive to undesired coupling from inductors used in DC-DC converters.

By way of example, assuming a metal-insulator-metal capacitor (MIMCAP) of 2 fF/um^2, the total capacitance of a quadrature down-conversion front-end (e.g., antenna port to the gain-boosted output) has a capacitance of about 150 pF. Since the switches of the mixer 106 and the low noise buffer 104 are negligibly small in a deep-submicron process, the area of the receiver may be estimated as about 2× the area required for the desired capacitance (assuming 50% of area is active MIMCAP), or about 375 um per side (which corresponds to 0.14 $mm^2$). Assuming a silicon cost of \$0.075/$mm^2$ the silicon cost of the receiver front-end having external bond-wire matching (e.g., for the inductance) would be about one penny in this example.

Figure 6:
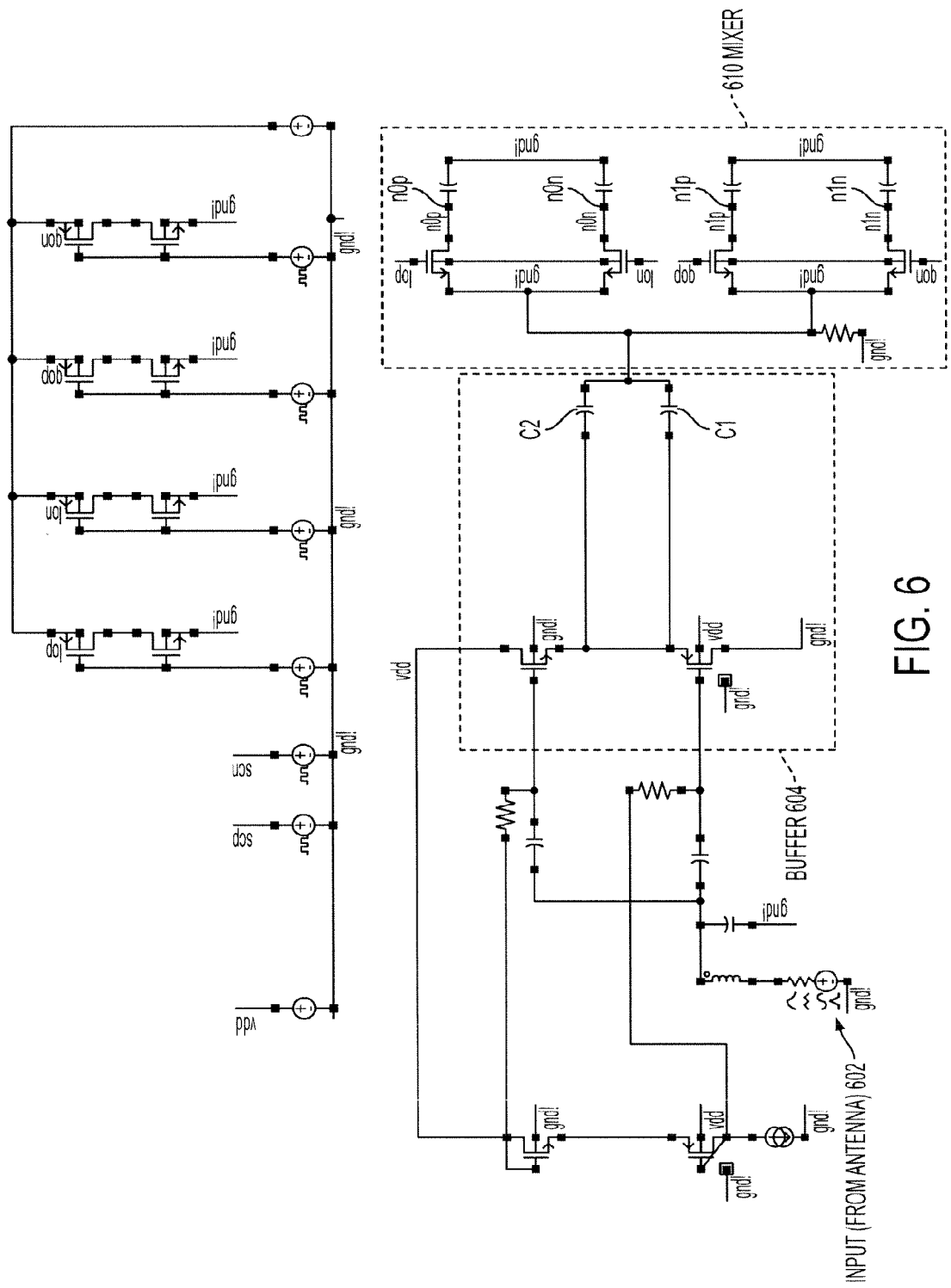
FIG. 6 illustrates a first part of a simulation model, consistent with an embodiment of the present invention.

By way of example, FIGS. 6 to 13 illustrate schematics and simulation results of a low power radio receiver consistent with an embodiment of the present invention. FIG. 6 illustrates a simulation model that includes an input port 602 (e.g., from an antenna), a buffer 604, and a quadrature mixer 610, consistent with an embodiment of the present invention. The buffer is capacitively coupled to quadrature mixer 610 through capacitors C1 and C2. Of course, capacitors C1 and C2 can be replaced by a single capacitor. The mixer 610 includes differential outputs n0n/p and n1p/n, respectively.

Figure 7:
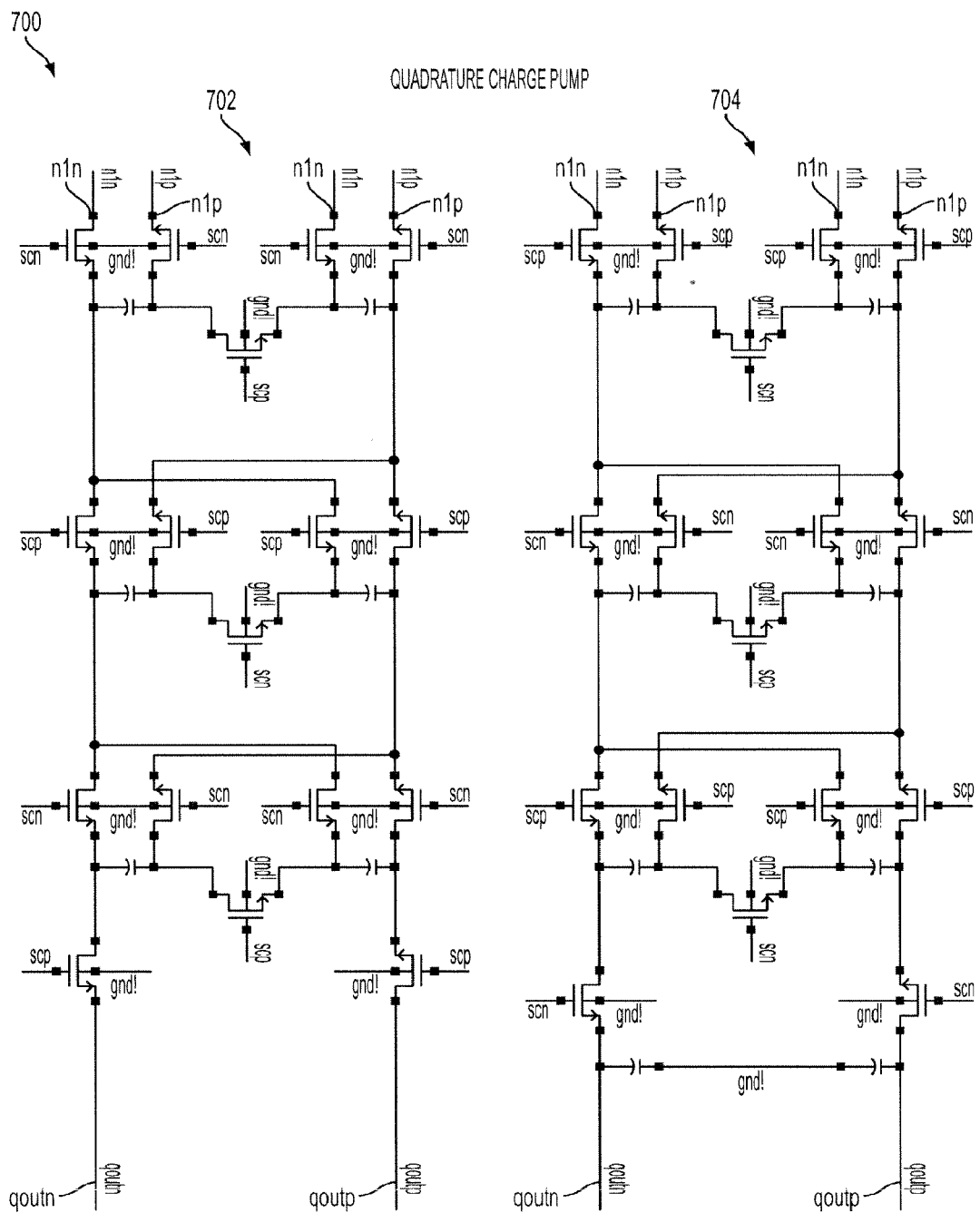
FIG. 7 illustrates a second part of a simulation model, consistent with an embodiment of the present invention.
Figure 7:
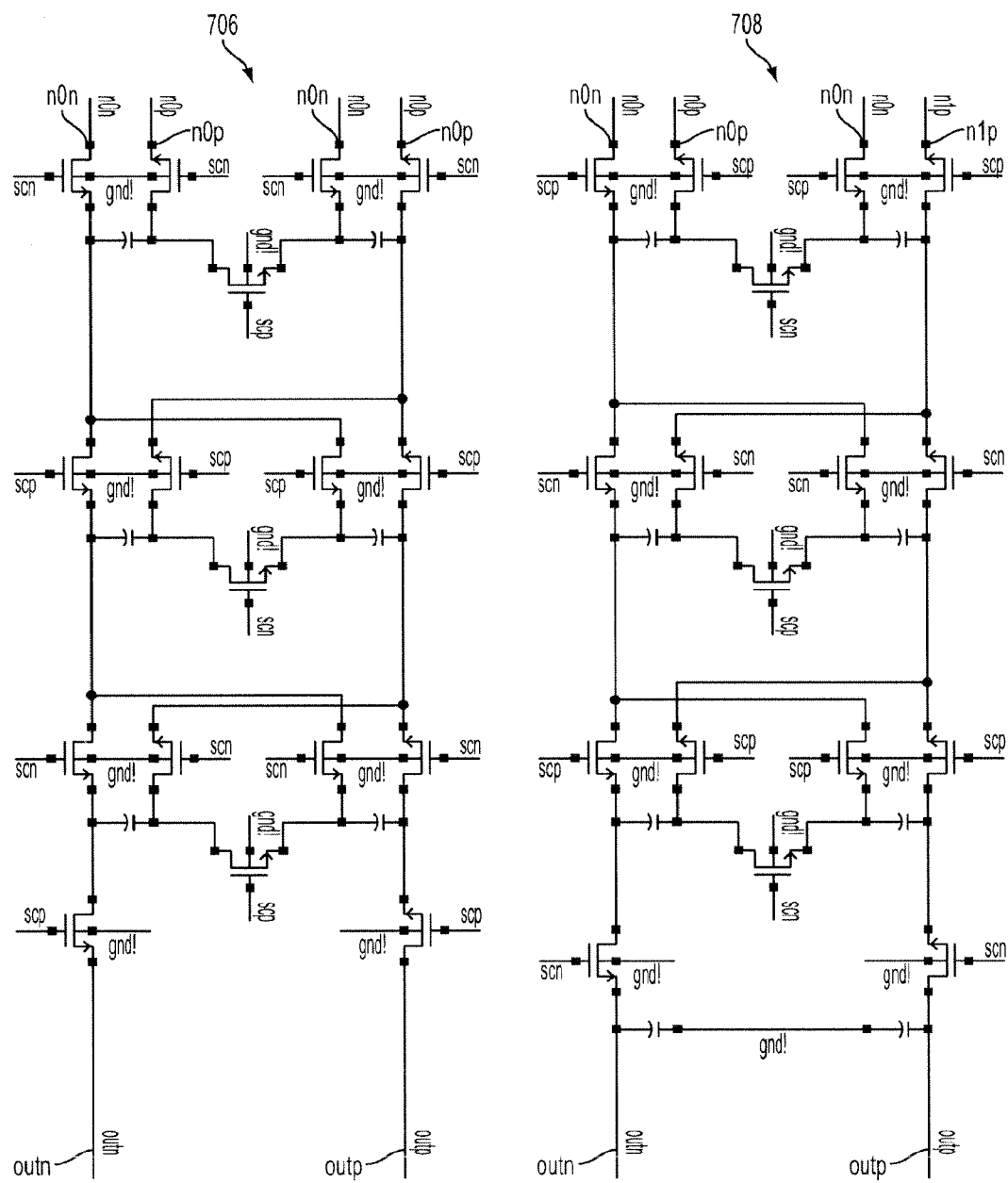

FIG. 7 illustrates a simulation model of a two-channel charge pump for quadrature signal processing, consistent with an embodiment of the present invention. Charge pumps 706 and 708 (e.g., connected to the in-phase mixer) operate 180 degrees out of phase with each other: when one charge pump (e.g., 708) is sampling, the other charge pump (e.g., 706) is dumping. The additional two charge pumps 702 and 704 (e.g., connected to the quadrature-phase mixer) collectively make charge pump 700 a quadrature charge pump. In some embodiments the quadrature charge pump 700 is coupled to the mixers 610 of FIG. 6. For example, inputs n0n/p and n1p/n are provided by the mixers 610. The quadrature charge pump provides differential outputs outp/n and qoutp/n respectively. The front end with a buffer 604 and passive voltage booster (i.e., charge pump) of FIGS. 6 and 7 are appropriate to implement an IEEE 802.15.4 standard compliant receiver.

Figure 8:
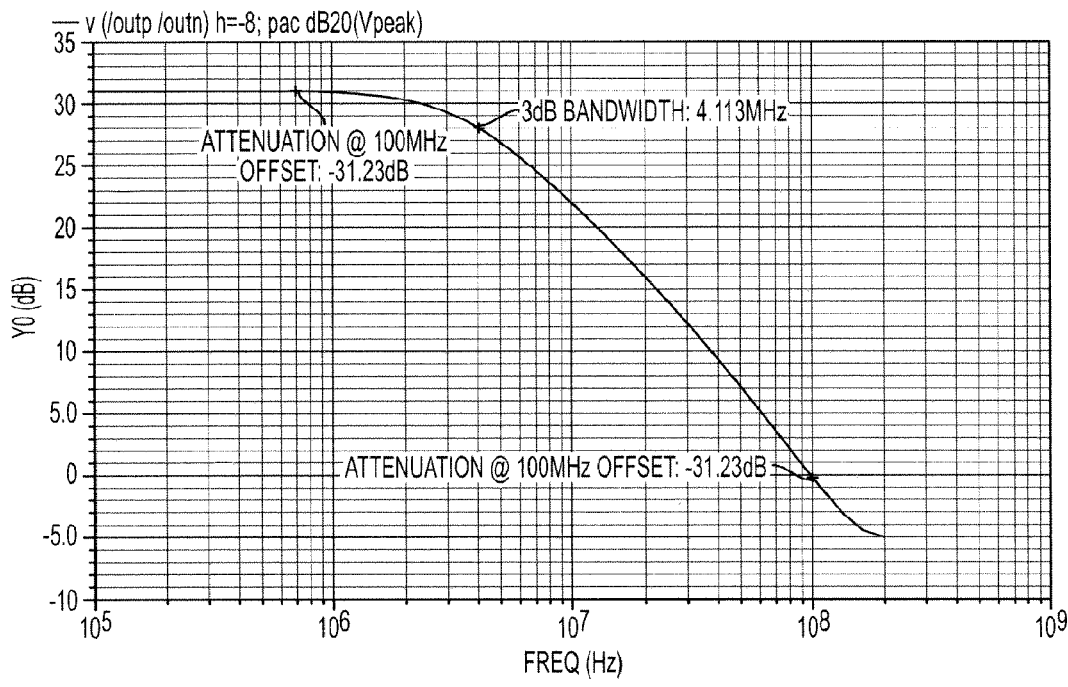
FIG. 8 illustrates an AC response of a low power radio receiver consistent with an embodiment of the present invention.

Simulation results of this exemplary embodiment, illustrated in FIGS. 8 to 12, have the mixer 610 switches driven in quadrature (e.g., at 2.5 GHz) and the passive voltage booster (i.e., charge pump 700) driven at 312.5 MHz. In one embodiment the passive voltage booster is driven by a clock derived from the VCO by dividing the VCO frequency. In this example, the current is 1.3 mA@1.2V through the source followers of buffer 604. For example, about 775 uA is consumed to drive the mixer 610 switches (which are each 50 μm/0.06 μm). A matching network with a bond-wire inductor with a Q of 30 is assumed. Some of the relevant performance metrics are listed below:

Noise Figure @ 2.5 MHz: 4.3 dB
3 dB Bandwidth at the output: 4.1 MHz
Gain from antenna to voltage booster output: 31 dB
Outband attenuation 40 MHz/100 MHz: 22 dB/31 dB
Output noise density: 23 nV/rtHz (equivalent to a 32k resistor)
P1dB: −11/−9 dBm @ 40/100 MHz Offset FIG. 8 illustrates an AC response of a receiver consistent with an embodiment of the present invention. For example, the LO is at 2.5 GHz and a buffer similar to 104c of FIG. 2c is used. The curve in FIG. 8 illustrates voltage amplitude at the output of the in-phase gain booster versus frequency distance from the LO frequency (2.5 GHz in this example) for a constant input-signal amplitude at the antenna port. Thus, with no active voltage amplification (e.g., the only actively-biased device here is the buffer) the receiver provides a 3 dB bandwidth of over 4 MHz and over 30 dB of DC voltage gain. It will be appreciated that such a combination of high DC gain, high bandwidth, and sharp roll-off is not readily achievable with conventional techniques based on low noise amplifiers (LNA) or passive-mixer-first architectures.

Figure 9:
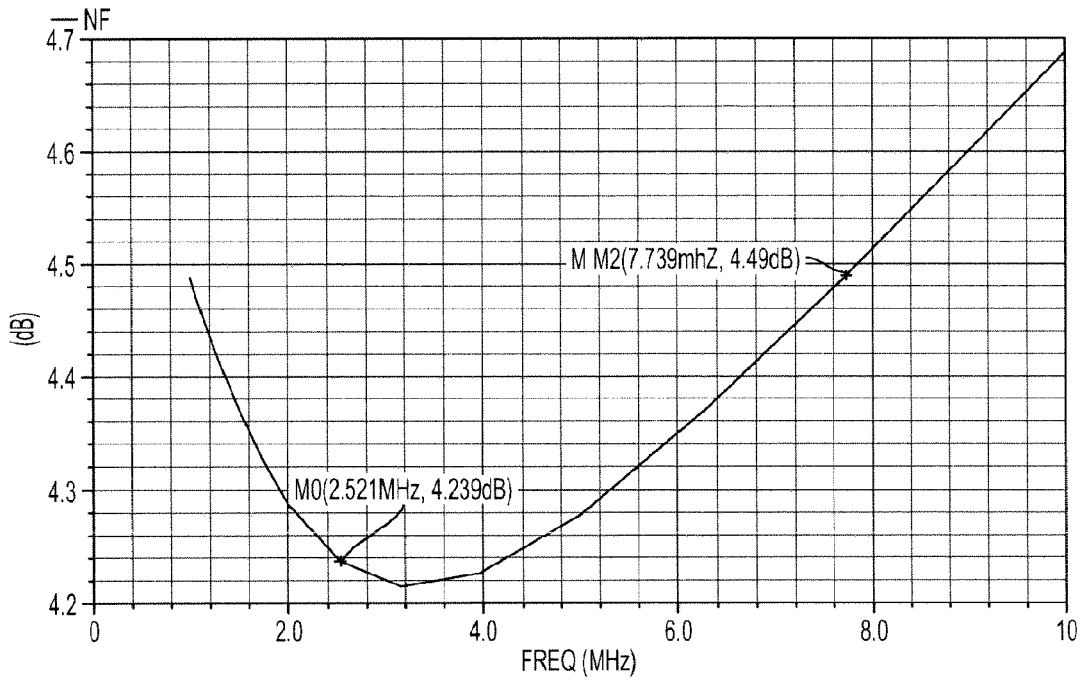
FIG. 9 illustrates a noise figure of a low power radio receiver consistent with an embodiment of the present invention.

FIG. 9 illustrates a noise figure (NF) of a receiver consistent with an embodiment of the present invention. As discussed before, NF is a measure of degradation of the signal-to-noise ratio caused by components in the signal path (e.g., from the antenna to the output of the in-phase gain booster). The NF includes the noise contributions of an 8× gain stage at the output of the mixer, as discussed in the context of FIG. 5. The NF in FIG. 9, provides a number by which the performance of the receiver can be evaluated. In this example, the NF is between 4.2 and 4.3 in the frequency range of interest, which is exceptionally low compared to conventional architectures given the power consumption of the receiver.

Figure 10:
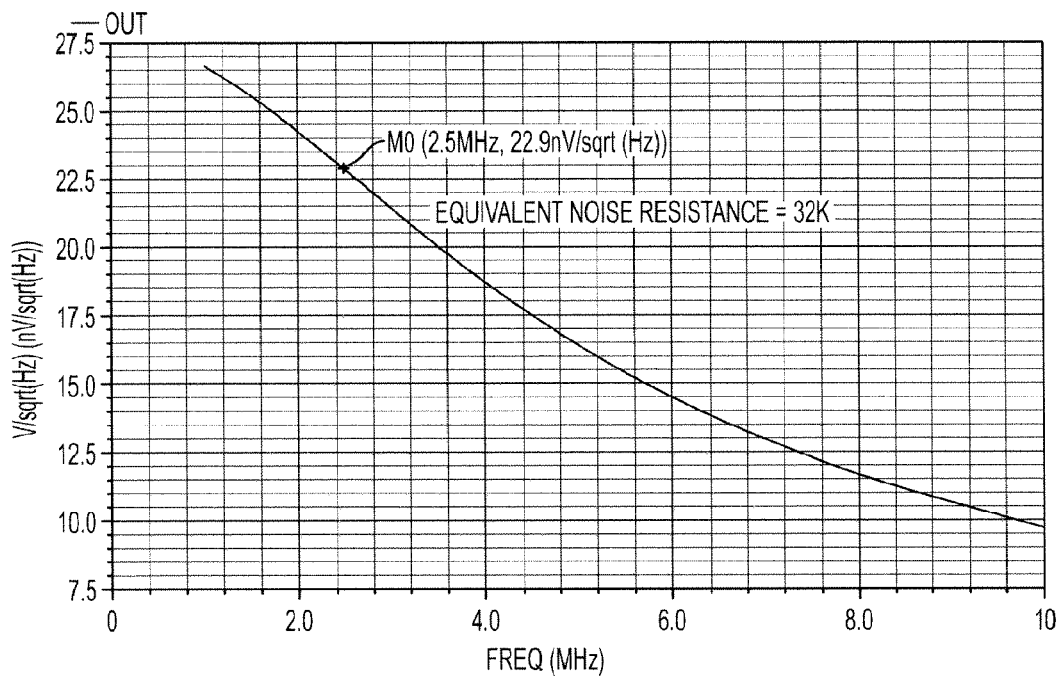
FIG. 10 illustrates noise density of a low power radio receiver consistent with an embodiment of the present invention.

FIG. 10 illustrates output noise density of a receiver consistent with an embodiment of the present invention. It illustrates that at 2.5 MHz, the noise density is 22.9 nV/sqrt (Hz), which is high compared to the equivalent noise resistance at the input of the receiver. Indeed, the high equivalent noise resistance is similar to the noise resistance of a 32KΩ resistor. This noise is a consequence of the over 30 dB of gain provided by the receiver, which amplifies not only desired signals but noise as well, as discussed in the context of FIG. 8. Thus, if additional gain is required (e.g., when 30 dB of gain is not enough), a low power amplifier (which has more noise than a high power amplifier) could be used after this receiver front end. Accordingly, the overall system, including the additional low power amplifier, would draw less current and occupy less real estate than approaches of the prior art.

Figure 11:
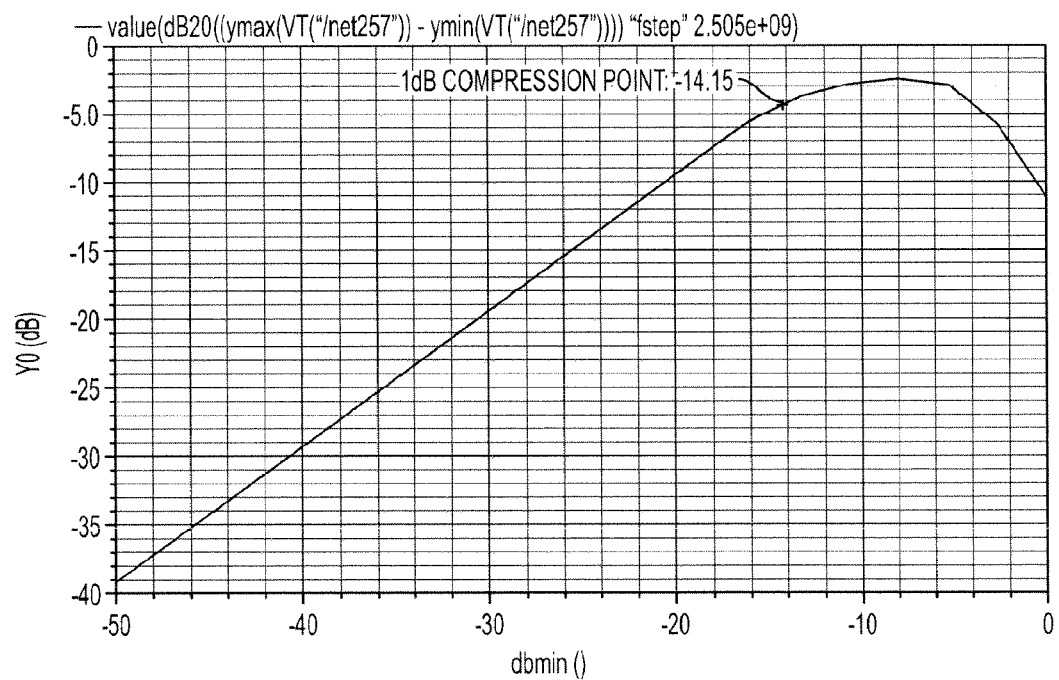
FIG. 11 illustrates a measure of linearity of a low power radio receiver consistent with an embodiment of the present invention.

FIG. 11 illustrates linearity of a receiver consistent with an embodiment of the present invention. One measure of linearity is through the 1 dB compression point, which is defined as the input power (input-referred) or output power (output-referred) where the gain is 1 dB less than the small signal gain. In this example, the 1 dB compression point is at −14.15 dBm. Higher 1 dB compression point provides for improved rejection of strong, undesired signals at the antenna port as well as accurate reception of strong desired signals in the band of interest.

Figure 12:
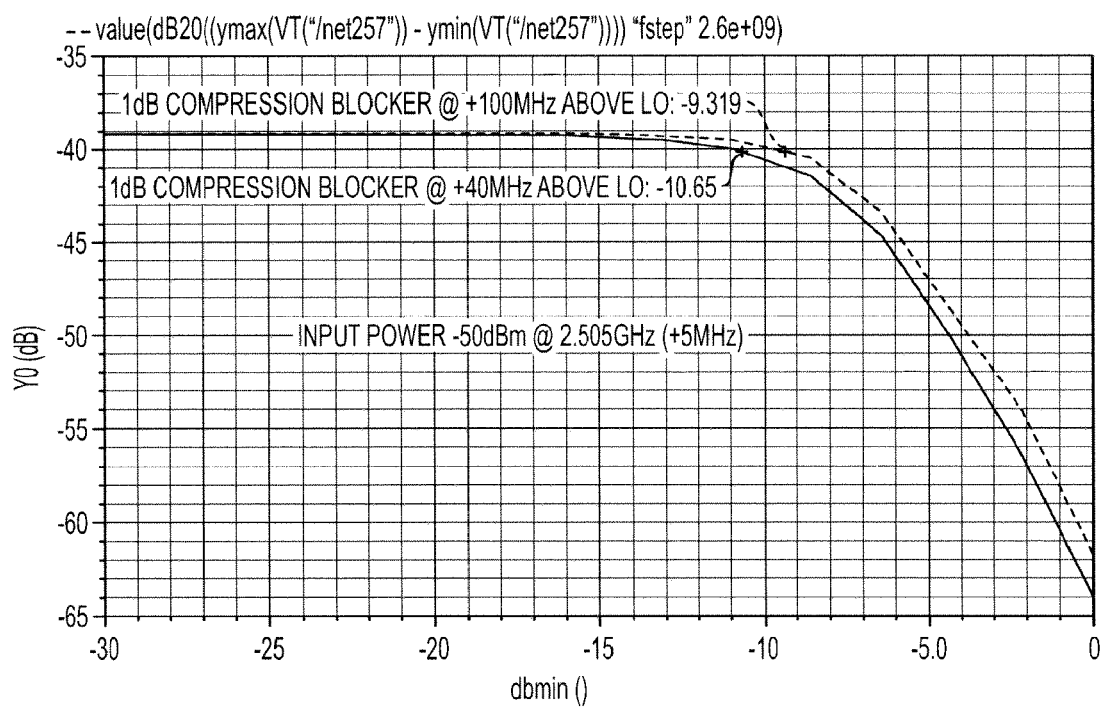
FIG. 12 illustrates 1 dB compression points at different blocker frequencies of a low power radio receiver consistent with an embodiment of the present invention.

FIG. 12 illustrates desired-signal amplitude (e.g. amplitude of a signal within the channel selected) at the output of the passive mixer with (i) an undesired tone at 100 MHz above the channel center and (ii) an undesired tone at 40 MHz above the channel center. Thus, if the undesired tone is 100 MHz away from the channel center the receiver can tolerate a −9.32 dBm blocker before the desired signal amplitude gain is reduced by 1 dB. At 40 MHz away, the receiver is tolerant to a −10.65 dBm blocker before the desired signal amplitude gain is reduced by 1 dB. Higher 1 dB compression point for out-of-band signals provides for improved rejection of strong, undesired signals at the antenna port.

It should be noted that the switches described herein may be PMOS, NMOS, PMOS in parallel with an NMOS, driven in a complementary fashion, BJT, or any other known switch. Switch-cap charge injection techniques such as bottom plate sampling and dummy switches may be used to attenuate the effects of charge injection.

In some embodiments an active gain stage follows the voltage booster output while in other embodiments an active gain stage with AC coupling at the input, output, or both, follows the voltage booster output. AC coupling may be used to remove DC offset and/or flicker noise from the signal path. The active gain stage may be disabled (e.g., removed) from the signal path as part of an automatic gain control (AGC) operation.

The components, steps, features, objects, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits and advantages. These also include embodiments in which the components and/or steps are arranged and/or ordered differently. For example, bipolar transistors (e.g., PNP or NPN) can be used instead of MOS transistors. Further, a PNP may be used instead of NPN, and a PMOS may be used instead of NMOS. Accordingly, it is intended that the invention be limited only in terms of the appended claims.

What is claimed is:

1. A frequency converting element comprising:
a mixer having first and second input nodes and an output node; and
a charge pump,
wherein an input node of the charge pump is coupled to the output node of the mixer, and
wherein the charge pump receives a mixer output signal at the input node of the charge pump, and outputs an amplified version of the mixer output signal, and
wherein the input node of the charge pump is directly coupled to the output node of the mixer.

2. A wireless receiver comprising:
the frequency converting element of claim 1;
an oscillator coupled to the first input node of the mixer of the frequency converting element; and
an antenna operatively coupled to the second input node of the mixer of the frequency converting element,
wherein the mixer receives a signal from the antenna at the first input node and outputs a mixed version of the signal received from the antenna at the output node, and the charge pump operates on the mixed version of the signal received from the antenna to output an amplified version of the mixed version of the signal received from the antenna.

3. The wireless receiver of claim 2, wherein the mixer is a passive mixer.

4. The wireless receiver of claim 3, further comprising:
a buffer having an input coupled to the antenna and an output coupled to the second input node of the mixer of the frequency converting element, such that the antenna is operatively coupled to the mixer through the buffer, wherein an operative coupling between the antenna and the buffer is passive.

5. The wireless receiver of claim 2, wherein the charge pump receives a clock signal having a frequency lower than a frequency of the oscillator coupled to the first input node of the mixer.

6. The frequency converting element of claim 1, wherein:
the charge pump is a first charge pump,
the frequency converting element further comprises a second charge pump having an input node coupled to the output node of the mixer,
the first and second charge pumps each alternate between sampling and gain phases of operation, and
the first and second charge pumps are operated out of phase with each other such that the first charge pump operates in the sampling phase of operation while the second charge pump operates in the gain phase of operation.

7. A wireless receiver comprising:
a first frequency converting element in accordance with claim 1;
a second frequency converting element in accordance with claim 1; and
an antenna operatively coupled to the first input nodes of the mixers of each of the first and second frequency converting elements,
wherein the mixers of the first and second frequency converting elements receive respective local oscillator signals at respective second input nodes thereof.

8. The wireless receiver of claim 7, wherein each of the first and second frequency converting elements includes first and second charge pumps that operate out of phase with each other.

9. The frequency converting element of claim 1, wherein the charge pump provides a frequency-filtering characteristic.

10. The frequency converting element of claim 1, wherein the charge pump provides passive voltage gain by processing a charge presented to the input of the charge pump.

11. A frequency converting element comprising:
a mixer having first and second input nodes and an output node; and
a charge pump,
wherein:
an input node of the charge pump is coupled to the output node of the mixer,
the charge pump receives a mixer output signal at the input node of the charge pump, and outputs an amplified version of the mixer output signal,
the charge pump is a first charge pump, and
the frequency converting element further comprises a second charge pump having an input node coupled to an output node of the first charge pump.

12. The frequency converting element of claim 11, wherein:
the first charge pump and the second charge pump each include a plurality of switches and capacitors, and
the switches and capacitors in the second charge pump are smaller than switches and capacitors in the first charge pump.

13. The frequency converting element of claim 11, wherein the first and second charge pumps are connected in series, and the series-connected first and second charge pumps operate at different frequencies.

14. The frequency converting element of claim 11, wherein the first and second charge pumps are connected in series, and the series-connected first and second charge pumps operate at a same frequency.

15. A frequency converting element comprising:
a mixer having first and second input nodes and an output node; and
a charge pump,
wherein:
an input node of the charge pump is coupled to the output node of the mixer,
the charge pump receives a mixer output signal at the input node of the charge pump, and outputs an amplified version of the mixer output signal, and
the charge pump comprises first and second capacitors, and the charge pump is operative to configure the first and second capacitors in parallel at the input node of the charge pump during a sampling phase of operation and to configure the first and second capacitors in series at an output node of the charge pump during a gain phase of operation that does not overlap with the sampling phase of operation.

* * * * *